US012628620B1

(12) United States Patent
Byagowi et al.

(10) Patent No.: US 12,628,620 B1
(45) Date of Patent: May 12, 2026

(54) DIE LEVEL INTEGRATED CONNECTION TEST CIRCUIT AND METHOD THEREFOR

(71) Applicant: Meta Platforms, Inc., Menlo Park, CA (US)

(72) Inventors: Ahmad Byagowi, Menlo Park, CA (US); Pradip Sairam Pichumani, Fremont, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 258 days.

(21) Appl. No.: 18/134,388

(22) Filed: Apr. 13, 2023

(51) Int. Cl.
| | |
|---|---|
| *H01L 21/66* | (2006.01) |
| *G01R 31/28* | (2006.01) |
| *H10P 74/00* | (2026.01) |

(52) U.S. Cl.
CPC .......... *H10P 74/27* (2026.01); *G01R 31/2896* (2013.01)

(58) Field of Classification Search
CPC ............................ H01L 22/30; G01R 31/2896
See application file for complete search history.

(56) References Cited

U.S. PATENT DOCUMENTS

| | | | | |
|---|---|---|---|---|
| 5,872,449 A * | 2/1999 | Gouravaram | ........... | H01L 22/34 |
| | | | | 324/750.14 |
| 5,929,650 A * | 7/1999 | Pappert | .............. | G01R 31/3008 |
| | | | | 714/25 |
| 6,251,695 B1 * | 6/2001 | Kwon | ..................... | H01L 22/20 |
| | | | | 257/E23.179 |

| | | | | |
|---|---|---|---|---|
| 6,759,860 B1 * | 7/2004 | Hsiung | .............. | G01R 31/2896 |
| | | | | 324/750.19 |
| 9,726,722 B1 * | 8/2017 | Solt | ................. | G01R 31/318513 |
| 10,262,911 B1 * | 4/2019 | Gong | ..................... | H01L 22/34 |
| 2002/0133748 A1 * | 9/2002 | Corr | ................. | G01R 19/16552 |
| | | | | 714/25 |
| 2007/0001687 A1 * | 1/2007 | Schneider | ............ | G01R 31/312 |
| | | | | 324/605 |
| 2014/0070838 A1 * | 3/2014 | Vukic | ................ | G01R 31/2853 |
| | | | | 324/762.03 |
| 2014/0181609 A1 * | 6/2014 | Whetsel | ......... | G01R 31/318511 |
| | | | | 714/729 |
| 2015/0276854 A1 * | 10/2015 | Cejka | ................. | G01R 31/2818 |
| | | | | 324/762.02 |
| 2016/0098561 A1 * | 4/2016 | Keller | ................... | G06F 21/566 |
| | | | | 726/24 |

(Continued)

*Primary Examiner* — Akm Zakaria
(74) *Attorney, Agent, or Firm* — EVERSHEDS SUTHERLAND (US) LLP

(57) ABSTRACT

In some embodiments, an integrated circuit (IC) chip package, includes a die; and die level diagnostic cell circuitry embedded in the die at a die level diagnostic testing location, wherein the die level diagnostic cell circuitry located at the die level diagnostic testing location incorporates a die level diagnostic stimulus to test a diagnostic trace of the die without requiring a decapsulation of the integrated circuit chip package. In some embodiments, the die level diagnostic cell circuitry is utilized to capture at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

19 Claims, 9 Drawing Sheets

(56) References Cited

U.S. PATENT DOCUMENTS

| 2018/0340977 A1* | 11/2018 | Chakraborty .. G01R 31/318513 |
| 2021/0280463 A1 | 9/2021 | Ecton et al. |
| 2023/0308132 A1* | 9/2023 | Gonzales ............... H04B 3/145 |
| 2023/0417828 A1* | 12/2023 | Yu ........................ H03K 17/955 |

* cited by examiner

DIE LEVEL INTEGRATED CONNECTION TEST CIRCUIT AND METHOD THEREFOR

BACKGROUND

Packaged semiconductor products are generally tested for quality control and functionality purposes in order to ship high-end semiconductor products to meet the current demands of customers. Generally, in order to test the packaged semiconductors, the packaged semiconductors are decapsulated in order to access and appropriately test dies and other components located inside the packaged semiconductors. Unfortunately, decapsulation and other destructive testing techniques utilized to test the internal components of the semiconductor package are not always desirable due to the prohibitive costs associated with performing decapsulation. Furthermore, the electrical properties of the components of the semiconductor package (e.g., dies, interconnects, packaging, and printed circuit boards (PCBs), etc.) are difficult to attain post assembly without utilizing costly external testing equipment. Therefore, a need exists to provide improved testing techniques for packaged semiconductors.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods, systems, and computer readable mediums that store code for performing methods are described herein. In one aspect, an integrated circuit chip package, includes a die; and die level diagnostic cell circuitry embedded in the die at a die level diagnostic testing location. In some embodiments, the die level diagnostic cell circuitry is located at a corner location of the die and utilizes a die level diagnostic cell circuitry-based stimulus to test a die level diagnostic cell circuitry stimulus driven diagnostic trace of the integrated circuit chip package without requiring a decapsulation of the integrated circuit chip package. In some embodiments, the die level diagnostic cell circuitry is utilized to ascertain at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

Further features and advantages of embodiments, as well as the structure and operation of various embodiments, are described in detail below with reference to the accompanying drawings. It is noted that the methods and systems are not limited to the specific embodiments described herein. Such embodiments are presented herein for illustrative purposes only. Additional embodiments will be apparent to persons skilled in the relevant art(s) based on the teachings contained herein.

DETAILED DESCRIPTION

Figure 1:
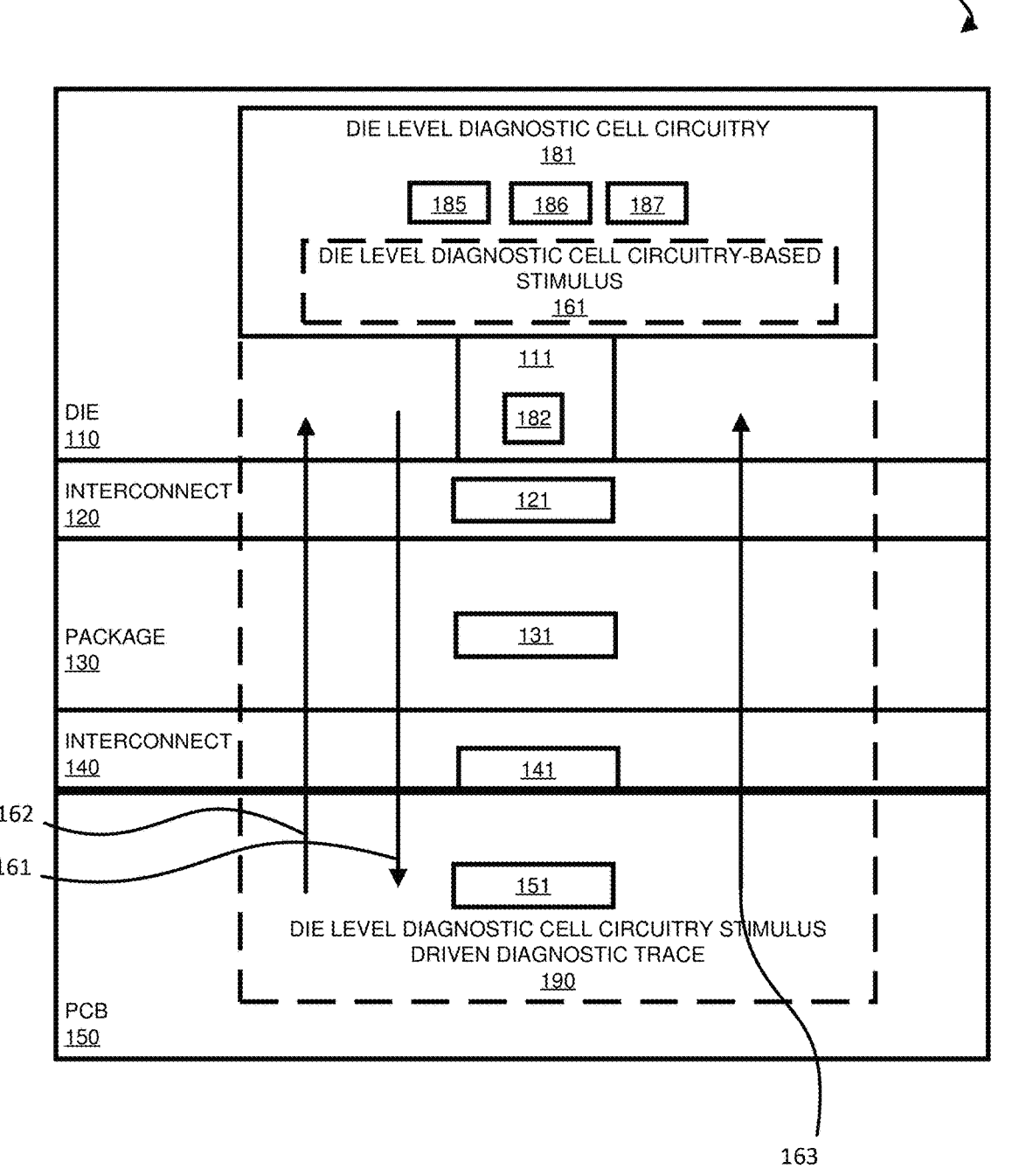
FIG. 1 illustrates a block diagram of a diagnostic cell circuitry-configured integrated circuit (IC) chip package that includes die level diagnostic cell circuitry in accordance with some embodiments.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" or "in some embodiments" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In some embodiments, the term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board (PCB) for interconnection with other packaged integrated circuits and discrete components, forming a larger circuit.

In some embodiments, the term "bond pad" generally refers to metallization structures that terminate integrated traces and vias in integrated circuit packages and dies. The term "solder pad" may be occasionally substituted for "bond pad" and carries the same meaning.

In some embodiments, the term "solder bump" generally refers to a solder layer formed on a bond pad. The solder layer typically has a round shape, hence the term "solder bump".

In some embodiments, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

In some embodiments, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In some embodiments, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

In some embodiments, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

In some embodiments, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Throughout the specification, and in the claims, the term "connected" means a direct connection, such as electrical, mechanical, or magnetic connection between the things that are connected, without any intermediary devices.

In some embodiments, the term "coupled" means a direct or indirect connection, such as a direct electrical, mechanical, magnetic or fluidic connection between the things that are connected or an indirect connection, through one or more passive or active intermediary devices.

In some embodiments, the term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1 illustrates a block diagram of a diagnostic cell circuitry-configured IC chip package 100 in accordance with some embodiments. In some embodiments, the diagnostic cell circuitry-configured IC chip package 100 is configured to utilize die level diagnostic cell circuitry 181 in die 110 to ascertain diagnostic characteristics of diagnostic cell circuitry-configured IC chip package 100 during testing of diagnostic cell circuitry-configured IC chip package 100. In some embodiments, die level diagnostic cell circuitry 181 is circuitry in die 110 that is configured to generate a die level diagnostic cell circuitry-based stimulus 161 that is provided to a die level diagnostic cell circuitry stimulus driven diagnostic trace 190 of the diagnostic cell circuitry-configured IC chip package 100. In some embodiments, the die level diagnostic cell circuitry 181 utilizes die level diagnostic cell circuitry-based stimulus reflections (e.g., reflected die level diagnostic cell circuitry-based stimulus 162) captured at the die level diagnostic cell circuitry 181 for a reflection-type die level diagnostic cell circuitry stimulus driven diagnostic trace 190 and/or die level diagnostic cell-circuitry-based stimulus transmissions (e.g., transmitted die level diagnostic cell circuitry-based stimulus 163) captured at the die level diagnostic cell circuitry 181 for a transmission type die level diagnostic cell circuitry stimulus driven diagnostic trace 190) to ascertain diagnostic characteristics (e.g., impedance, resistance, inductance, capacitance) during the testing of diagnostic cell circuitry-configured IC chip package 100, as described further in detail herein with reference to FIG. 1-FIG. 10.

In some embodiments, the diagnostic cell circuitry-configured IC chip package 100 includes a die 110, an interconnect 120, a package 130, an interconnect 140, a PCB 150, and a die level diagnostic cell circuitry stimulus driven diagnostic trace 190. In some embodiments, die 110 is coupled to package 130 via interconnect 120. In some embodiments, package 130 is coupled to PCB 150 via interconnect 140. In some embodiments, interconnect 120 may include a plurality of solder bumps that are utilized to couple die 110 to external circuitry (e.g., circuitry in package 130). For example, interconnect 120 may be implemented using controlled collapse chip connection (C4) flip-chip bump technology, where solder bumps deposited on chip pads are utilized to interconnect die 110 to package 130. In some embodiments, interconnect 140 may include a plurality of solder bumps that are utilized to couple package 130 to PCB 150. For example, interconnect 140 may be implemented using chip connection (C2) bump technology, where C2 bumps comprising metallic pillar structures (e.g., copper pillars) couple package 130 to PCB 150.

In some embodiments, die 110 includes die level diagnostic cell circuitry 181. In some embodiments, as stated previously, die level diagnostic cell circuitry 181 is circuitry in die 110 that is configured to generate die level diagnostic cell circuitry-based stimulus 161, provide the die level diagnostic cell circuitry-based stimulus 161 to die level diagnostic cell circuitry stimulus driven diagnostic trace 190, and utilize die level diagnostic cell circuitry-based stimulus reflections captured at the die level diagnostic cell circuitry 181 and/or die level diagnostic cell-circuitry-based stimulus transmissions captured at the die level diagnostic cell circuitry 181 to ascertain diagnostic characteristics (e.g., impedance, resistance, inductance, capacitance) of the diagnostic cell circuitry-configured IC chip package 100 during testing operations.

In some embodiments, the die level diagnostic cell circuitry stimulus driven diagnostic trace 190 is a trace in diagnostic cell circuitry-configured IC chip package 100 that is configured to be driven by die level diagnostic cell circuitry-based stimulus 161 generated by the die level diagnostic cell circuitry 181. In some embodiments, the die level diagnostic cell circuitry stimulus driven diagnostic trace 190 is configured to extend through portions of die 110, interconnect 120, package 130, interconnect 140, and PCB 150. In some embodiments, the die level diagnostic cell circuitry stimulus driven diagnostic trace portions may include a die level circuitry portion 111, an interconnect portion 121, a package portion 131, an interconnect portion 141, and a PCB portion 151.

In some embodiments, the die level circuitry portion 111 is a circuit portion of die 110 that is included as a trace segment of the die level diagnostic cell circuitry stimulus driven diagnostic trace 190. In some embodiments, the die level circuitry portion 111 may include, for example, die level circuitry 182. In some embodiments, die level circuitry 182 is circuitry in die 110 that is to be tested as part of the die level diagnostic cell circuitry stimulus driven diagnostic trace 190. In some embodiments, the die level circuitry 182 may be, for example, back end of the line components (BEOL) and/or front end of the line (FEOL) components of die 110. In some embodiments, BEOL components are components formed during the back end of the line IC manufacturing process of die 110 of diagnostic cell circuitry-configured IC chip package 100. In some embodiments, the BEOL components of die 110 may include metal lines, which are used to connect different parts of the circuit, and vias, which are used to make vertical connections between different metal layers. In some embodiments, FEOL components are components formed during the front end of the line IC manufacturing process. In some embodiments, the FEOL components may include, for example, include transistors, diodes, capacitors, and resistors.

In some embodiments, interconnect portion 121 is an interconnect portion of interconnect 120 that is included as a trace segment of the die level diagnostic cell circuitry stimulus driven diagnostic trace 190. In some embodiments, the interconnect portion 121 may be, for example, a solder bump of interconnect 120 that couples die 110 to package 130. In some embodiments, package portion 131 is a package portion of package 130 that is included as a trace segment of the die level diagnostic cell circuitry stimulus driven diagnostic trace 190. In some embodiments, interconnect portion 141 is an interconnect portion of interconnect 140 that is included as a trace segment of the die level diagnostic cell circuitry stimulus driven diagnostic trace 190. In some embodiments, the interconnect portion 141 may be, for example, a solder bump of interconnect 120 that couples package 130 to PCB 150. In some embodiments, the PCB portion 151 is a PCB portion of PCB 150 that is included as a trace segment of the die level diagnostic cell circuitry stimulus driven diagnostic trace 190. In some embodiments, the die level diagnostic cell circuitry stimulus driven diagnostic trace 190 may extend through a lesser number or a greater number of portions of dies, interconnects, packages, and/or PCBs than those illustrated in FIG. 1. In some embodiments, die level diagnostic cell circuitry stimulus driven diagnostic trace 190 is configured to serve as a conduit for the transportation of the die level diagnostic cell circuitry-based stimulus 161 through the die level diagnostic cell circuitry stimulus driven diagnostic trace 190 of diagnostic cell circuitry-configured IC chip package 100.

In some embodiments, the die level diagnostic cell circuitry stimulus driven diagnostic trace 190 may be a reconfigurable die level diagnostic cell circuitry stimulus driven diagnostic trace. For example, the die level diagnostic cell circuitry stimulus driven diagnostic trace 190 may be created or generated using programmable logic devices with a matrix of configurable logic blocks and programmable interconnects that may be programmed to implement the reconfigurable trace using logic functions and interconnect topologies. In some embodiments, to create a reconfigurable trace (using, for example, an FPGA), the desired logic function is designed using a hardware description language, such as Verilog or VHDL. In some embodiments, after the logic function is designed, a synthesis tool may be utilized to convert the design into a set of logic gates and programmable interconnects that may be implemented on the FPGA. In some embodiments, after the design is synthesized, the FPGA is programmed with a bitstream that configures the logic and interconnects to implement the desired reconfigurable trace. In some embodiments, the bitstream may be loaded onto the FPGA using a programming cable or via an embedded processor on the FPGA.

In some embodiments, the die level diagnostic cell circuitry 181 includes a die level diagnostic cell circuitry-based stimulus generator 185, a die level diagnostic cell circuitry-based stimulus capturer 186, and a die level diagnostic assessment circuit 187. In some embodiments, die level diagnostic cell circuitry-based stimulus generator 185 is circuitry in die level diagnostic cell circuitry 181 that is configured to generate the die level diagnostic cell circuitry-based stimulus 161. In some embodiments, the die level diagnostic cell circuitry-based stimulus 161 is a die level testing signal/s generated by the die level diagnostic cell circuitry 181 that is configured to be utilized to perform testing of the die level diagnostic cell circuitry stimulus driven diagnostic trace 190 of diagnostic cell circuitry-configured IC chip package 100. In some embodiments, as stated previously, the die level diagnostic cell circuitry stimulus driven diagnostic trace 190 may include a single portion of the diagnostic cell circuitry-configured IC chip package 100 or multiple portions of the diagnostic cell circuitry-configured IC chip package 100 (e.g., die level circuitry portion 111, interconnect portion 121, package portion 131, interconnect portion 141, and/or PCB portion 151). In some embodiments, the die level diagnostic cell circuitry-based stimulus 161 generated by the die level diagnostic cell circuitry 181 may be, for example, a time domain diagnostic stimulus or a frequency domain diagnostic stimulus.

In some embodiments, die level diagnostic cell circuitry-based stimulus capturer 186 is a circuit in the die level diagnostic cell circuitry 181 configured to capture signals received from the from the die level diagnostic cell circuitry stimulus driven diagnostic trace 190. For example, in some embodiments, die level diagnostic cell circuitry-based stimulus capturer 186 is configured to capture signals reflected from the from the die level diagnostic cell circuitry stimulus driven diagnostic trace 190 (e.g., for a reflection-type die level diagnostic cell circuitry stimulus driven diagnostic trace) and/or signals transmitted through the die level diagnostic cell circuitry stimulus driven diagnostic trace 190 (e.g., for a transmission-type die level diagnostic cell circuitry stimulus driven diagnostic trace). In some embodiments, the die level diagnostic cell circuitry-based stimulus capturer 186 is configured to capture reflected signals from each portion of the die level diagnostic cell circuitry stimulus driven diagnostic trace 190 (e.g., die level circuitry portion 111, interconnect portion 121, package portion 131, interconnect portion 141, and PCB portion 151) and/or signals transmitted through each portion of the die level diagnostic cell circuitry stimulus driven diagnostic trace 190. In some embodiments, by capturing reflected signals associated with each portion of the die level diagnostic cell circuitry stimulus driven diagnostic trace 190 and/or signals transmitted through each portion of the die level diagnostic cell circuitry stimulus driven diagnostic trace 190, the die level diagnostic cell circuitry 181 is able to ascertain diagnostic characteristics specific to each portion of the die level diagnostic cell circuitry stimulus driven diagnostic trace 190, and utilize the diagnostic characteristics to characterize diagnostic issues affecting the associated portions of the die level diagnostic cell circuitry stimulus driven diagnostic trace 190.

In some embodiments, die level diagnostic assessment circuit 187 is a circuit in the die level diagnostic cell circuitry 181 configured to assess die level diagnostic cell circuitry-based signals (e.g., reflected die level diagnostic cell circuitry-based stimulus 162 and transmitted die level diagnostic cell circuitry-based stimulus 163) captured by die level diagnostic cell circuitry-based stimulus capturer 186. In some embodiments, die level diagnostic assessment circuit 187 is configured to utilize the reflected die level diagnostic cell circuitry-based stimulus 162 and transmitted die level diagnostic cell circuitry-based stimulus 163 to calculate and ascertain at least one of an inductance associated with the die level diagnostic cell circuitry stimulus driven diagnostic trace 190, a capacitance associated with the die level diagnostic cell circuitry stimulus driven diagnostic trace 190, an impedance associated with the die level diagnostic cell circuitry stimulus driven diagnostic trace 190, and a resistance associated with the die level diagnostic cell circuitry stimulus driven diagnostic trace 190.

In some embodiments, the die level diagnostic cell circuitry 181, the die level diagnostic cell circuitry-based stimulus 161, and the die level diagnostic cell circuitry stimulus driven diagnostic trace 190 are collectively configured to test and generate diagnostic characteristics of the diagnostic cell circuitry-configured IC chip package 100 to ensure compliance with manufacturer specifications without decapsulation of the diagnostic cell circuitry-configured IC chip package 100, as described further herein with reference to FIG. 2-FIG. 10.

Figure 2:
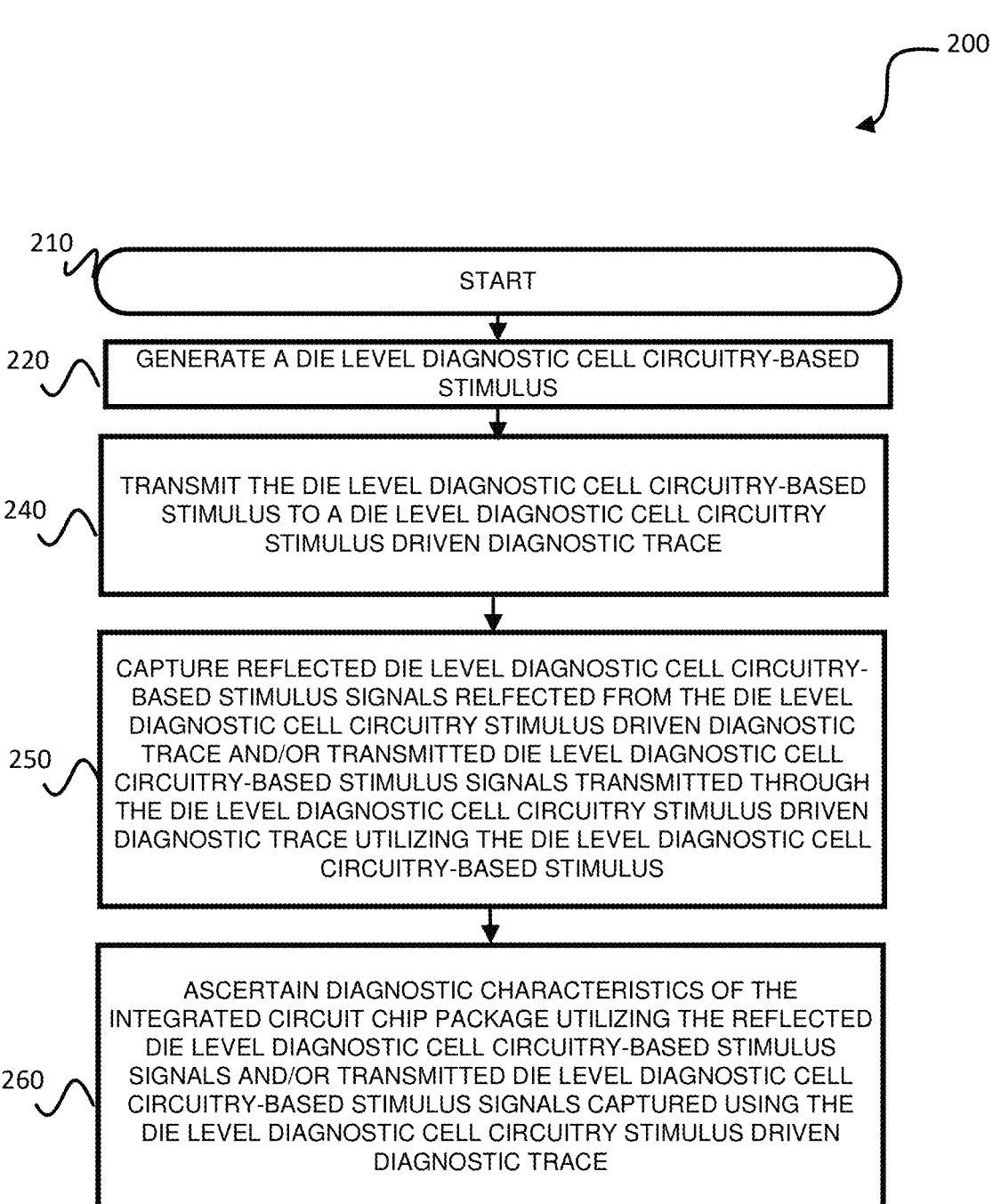
FIG. 2 illustrates die level diagnostic cell circuitry-based diagnostic testing method performed utilizing the die level diagnostic cell circuitry of FIG. 1 in accordance with some embodiments.

FIG. 2 illustrates die level diagnostic cell circuitry-based diagnostic testing method 200 performed utilizing the die level diagnostic cell circuitry 181 of FIG. 1 in accordance with some embodiments. In some embodiments, the die level diagnostic cell circuitry-based diagnostic testing method 200 is configured to generate diagnostic characteristics of diagnostic cell circuitry-configured IC chip package 100 that are utilized in characterizing and testing diagnostic cell circuitry-configured IC chip package 100 (or portions thereof). In some embodiments, an improvement of the die level diagnostic cell circuitry-based diagnostic testing method 200 over other IC chip packaging testing techniques, is that the die level diagnostic cell circuitry-based diagnostic testing method 200 may be performed on the diagnostic cell circuitry-configured IC chip package 100 without decapsulating diagnostic cell circuitry-configured IC chip package 100. The method, process steps, or stages illustrated in the figures may be implemented as an independent routine or process, or as part of a larger routine or process. Note that each process step or stage depicted may be implemented as an apparatus that executes a set of instructions, a method, or a system, among other embodiments.

In some embodiments, in order to initiate the die level diagnostic cell circuitry-based diagnostic testing method 200, the die level diagnostic cell circuitry-based diagnostic testing method 200 commences at operation 210. In some embodiments, at operation 220, die level diagnostic cell circuitry-based stimulus generator 185 of die level diagnostic cell circuitry 181 generates a die level diagnostic cell circuitry-based stimulus 161 for transmission to die level diagnostic cell circuitry stimulus driven diagnostic trace 190. In some embodiments, the die level diagnostic cell circuitry-based stimulus 161 generated by the die level diagnostic cell circuitry 181 may be, for example, at least one of a time domain diagnostic stimulus or a frequency domain diagnostic stimulus. In some embodiments, after generating the die level diagnostic cell circuitry-based stimulus 161, operation 220 proceeds to operation 240.

In some embodiments, at operation 240, die level diagnostic cell circuitry 181 transmits the die level diagnostic cell circuitry-based stimulus 161 to the die level diagnostic cell circuitry stimulus driven diagnostic trace 190. In some embodiments, the die level diagnostic cell circuitry 181 transmits the die level diagnostic cell circuitry-based stimulus 161 to the die level diagnostic cell circuitry stimulus driven diagnostic trace 190 for purposes of capturing signals that are reflected from and/or transmitted through die level diagnostic cell circuitry stimulus driven diagnostic trace portions of the die level diagnostic cell circuitry stimulus driven diagnostic trace 190. In some embodiments, as stated previously, the die level diagnostic cell circuitry stimulus driven diagnostic trace portions may include die level circuitry portion 111, interconnect portion 121, package portion 131, interconnect portion 141, and PCB portion 151. In some embodiments, after the die level diagnostic cell circuitry-based stimulus 161 is transmitted to the die level diagnostic cell circuitry stimulus driven diagnostic trace 190, operation 240 proceeds to operation 260.

In some embodiments, at operation 260, die level diagnostic cell circuitry-based stimulus capturer 186 of die level diagnostic cell circuitry 181 captures die level diagnostic cell circuitry-based stimulus signals received from the die level diagnostic cell circuitry stimulus driven diagnostic trace 190. For example, in some embodiments, when the die level diagnostic cell circuitry stimulus driven diagnostic trace 190 is a reflection-type die level diagnostic cell circuitry stimulus driven diagnostic trace, die level diagnostic cell circuitry-based stimulus capturer 186 captures die level diagnostic cell circuitry-based stimulus signals reflected from the die level diagnostic cell circuitry stimulus driven diagnostic trace 190 (e.g., reflected die level diagnostic cell circuitry-based stimulus 162). In some embodiments, when the die level diagnostic cell circuitry stimulus driven diagnostic trace 190 is a transmission-type die level diagnostic cell circuitry stimulus driven diagnostic trace, die level diagnostic cell circuitry 181 captures signals transmitted through (and optionally reflected from) the die level diagnostic cell circuitry stimulus driven diagnostic trace 190 (e.g., transmitted die level diagnostic cell circuitry-based stimulus 163). In some embodiments, as stated previously, by capturing signals received from the die level diagnostic cell circuitry stimulus driven diagnostic trace 190, die level diagnostic cell circuitry-based stimulus capturer 186 is able to ascertain diagnostic characteristics associated with the die level diagnostic cell circuitry stimulus driven diagnostic trace 190 that are utilized to characterize diagnostic issues affecting diagnostic cell circuitry-configured IC chip package 100. In some embodiments, after the die level diagnostic cell circuitry-based stimulus capturer 186 captures die level diagnostic cell circuitry-based stimulus signals from die level diagnostic cell circuitry stimulus driven diagnostic trace 190, die level diagnostic cell circuitry-based stimulus capturer 186 provides the captured signals to die level diagnostic assessment circuit 187 and operation 260 proceeds to operation 280.

In some embodiments, at operation 280, die level diagnostic assessment circuit 187 receives the reflected die level diagnostic cell circuitry-based stimulus 162 and/or transmitted die level diagnostic cell circuitry-based stimulus 163 from die level diagnostic cell circuitry-based stimulus capturer 186 and commences the process of ascertaining the diagnostic characteristics associated with the die level diagnostic cell circuitry stimulus driven diagnostic trace 190. For example, in some embodiments, for example, when the die level diagnostic cell circuitry-based stimulus capturer 186 captures inductance related signals, capacitance related signals, impedance related signals, and/or resistance related signals, the die level diagnostic assessment circuit 187 of die level diagnostic cell circuitry 181 computes at least one of an inductance associated with the die level diagnostic cell circuitry stimulus driven diagnostic trace 190, a capacitance associated with the die level diagnostic cell circuitry stimulus driven diagnostic trace 190, an impedance associated with the die level diagnostic cell circuitry stimulus driven diagnostic trace 190, and a resistance associated with the die level diagnostic cell circuitry stimulus driven diagnostic trace 190. In some embodiments, after the diagnostic characteristics of the diagnostic cell circuitry-configured IC chip package 100 have been ascertained by die level diagnostic assessment circuit 187, the die level diagnostic cell circuitry-based diagnostic testing method 200 ends.

Figure 3:
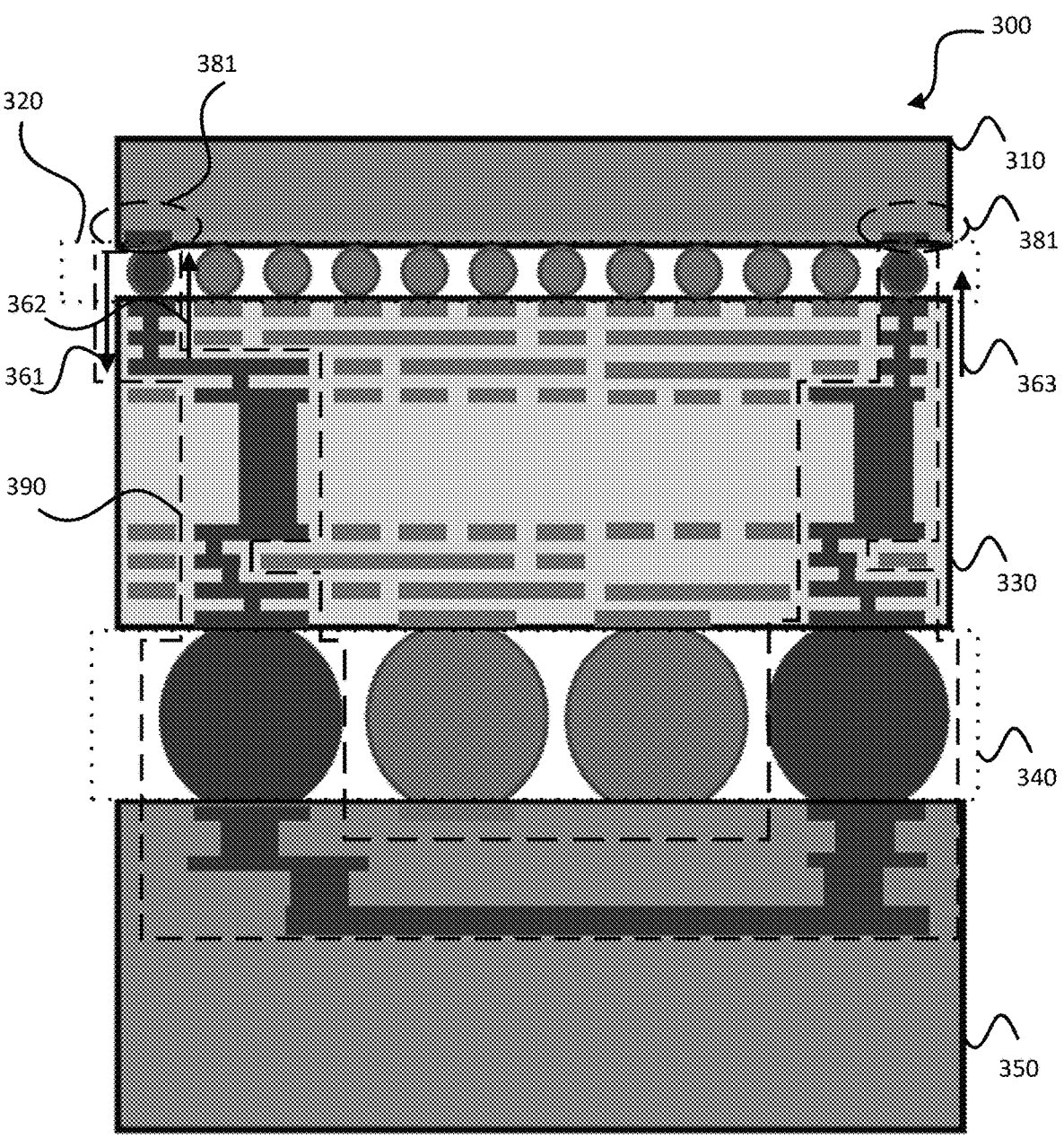
FIG. 3 illustrates an exemplary side view of example diagnostic cell circuitry-configured IC chip package used to implement the die level diagnostic cell circuitry-based diagnostic testing method of FIG. 2 in accordance with some embodiments.

FIG. 3 illustrates a side view of an example diagnostic cell circuitry-configured IC chip package 300 in accordance with some embodiments. The diagnostic cell circuitry-configured IC chip package 300 of FIG. 3 utilizes die level diagnostic cell circuitry-based diagnostic testing method 200 of FIG. 2 to perform decapsulation-free testing of the diagnostic cell circuitry-configured IC chip package 300. In the example illustrated in FIG. 3, in addition to including die 310, interconnect 320, package 330, interconnect 340, and PCB 350, the diagnostic cell circuitry-configured IC chip package 300 includes a transmission-type die level diagnostic cell circuitry stimulus driven diagnostic trace 390. In some embodiments, the transmission-type die level diagnostic cell circuitry stimulus driven diagnostic trace 390 is transmission circuitry (e.g., trace transmission circuitry) in diagnostic cell circuitry-configured IC chip package 300 that is utilized as a trace to transport die level diagnostic cell circuitry-based stimulus 361 through the diagnostic cell circuitry-configured IC chip package 300 (via transmission-type die level diagnostic cell circuitry stimulus driven diagnostic trace 390).

In some embodiments, for the example diagnostic cell circuitry-configured IC chip package 300 in FIG. 3, a die level diagnostic cell circuitry-based stimulus generator in die level diagnostic cell circuitry 381 of die 310 generates die level diagnostic cell circuitry-based stimulus 361. The die level diagnostic cell circuitry-based stimulus 361 is transmitted through the transmission-type die level diagnostic cell circuitry stimulus driven diagnostic trace 390 and output as transmitted die level diagnostic cell circuitry-based stimulus 363. In some embodiments, as the die level diagnostic cell circuitry-based stimulus 361 travels through the transmission-type die level diagnostic cell circuitry stimulus driven diagnostic trace 390, reflected signals (e.g., reflected die level diagnostic cell circuitry-based stimulus 362) that have been reflected from the various portions of the transmission-type die level diagnostic cell circuitry stimulus driven diagnostic trace 390 are received by the die level diagnostic cell circuitry 381.

In some embodiments, a die level diagnostic cell circuitry-based stimulus capturer in die level diagnostic cell circuitry 381 captures the reflected die level diagnostic cell circuitry-based stimulus 362 and the transmitted die level diagnostic cell circuitry-based stimulus 363 from the transmission-type die level diagnostic cell circuitry stimulus driven diagnostic trace 390. The die level diagnostic cell circuitry-based stimulus capturer provides the reflected die level diagnostic cell circuitry-based stimulus 362 and transmitted die level diagnostic cell circuitry-based stimulus 363 to a die level diagnostic assessment circuit in die level diagnostic cell circuitry 381.

In some embodiments, the die level diagnostic assessment circuit of die level diagnostic cell circuitry 381 assesses the reflected die level diagnostic cell circuitry-based stimulus 362 and the transmitted die level diagnostic cell circuitry-based stimulus 363 and generates the diagnostic parameters representative of the diagnostic characteristics associated with the transmission-type die level diagnostic cell circuitry stimulus driven diagnostic trace 390. As illustrated in the diagnostic cell circuitry-configured IC chip package 300 of FIG. 3, the die level diagnostic cell circuitry 381 utilizes the transmission-type die level diagnostic cell circuitry stimulus driven diagnostic trace 390 to ascertain diagnostic parameters associated with diagnostic cell circuitry-configured IC chip package 300 without having to decapsulate diagnostic cell circuitry-configured IC chip package 300.

Figure 4:
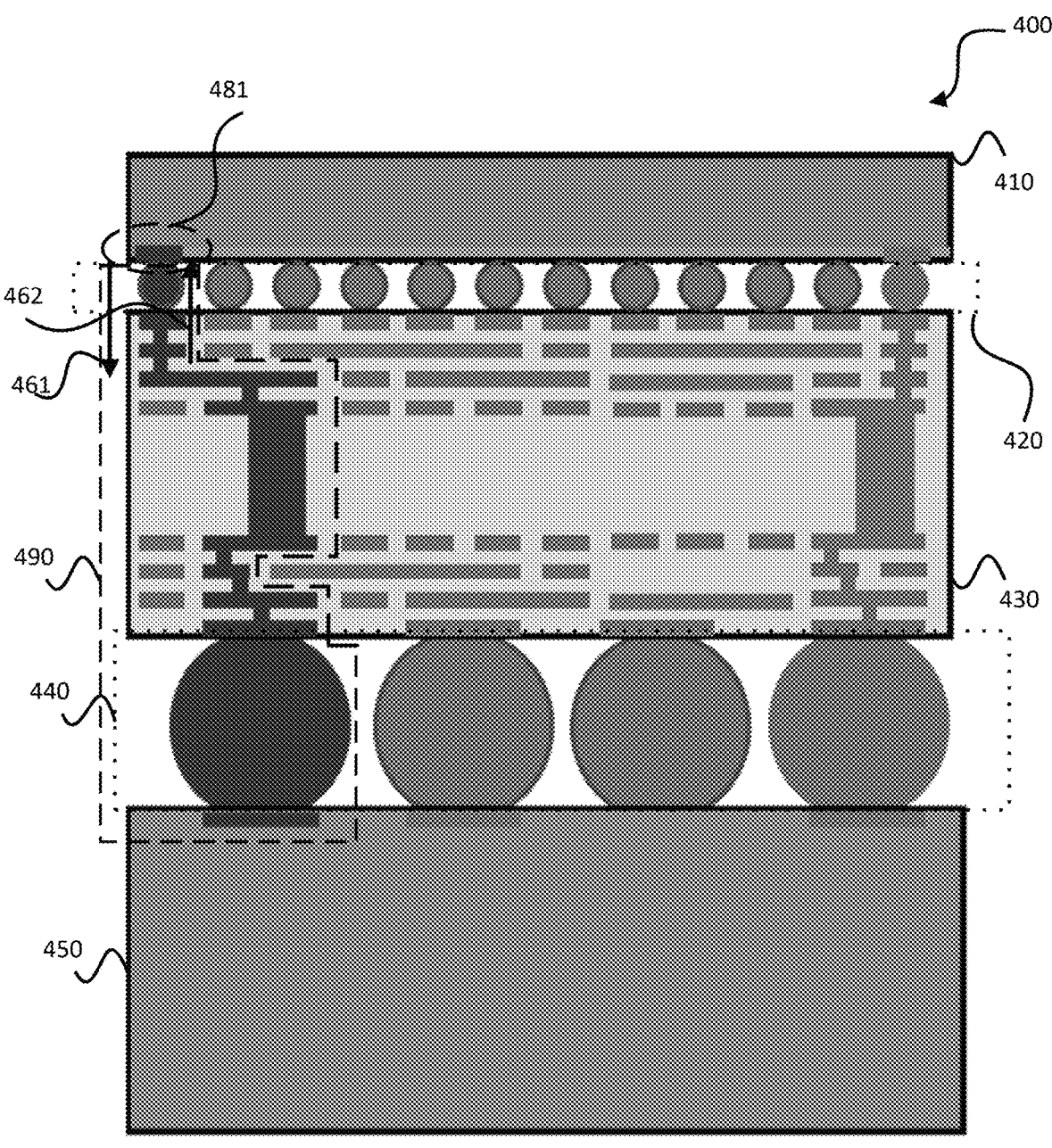
FIG. 4 illustrates an exemplary side view of an example diagnostic cell circuitry-configured IC chip package utilized to implement the die level diagnostic cell circuitry-based diagnostic testing method of FIG. 2 in accordance with some embodiments.

FIG. 4 illustrates a side view of an example diagnostic cell circuitry-configured IC chip package 400 in accordance with some embodiments. In some embodiments, the diagnostic cell circuitry-configured IC chip package 400 of FIG. 4 utilizes die level diagnostic cell circuitry-based diagnostic testing method 200 of FIG. 2 to perform decapsulation-free testing of the diagnostic cell circuitry-configured IC chip package 400. In the example illustrated in FIG. 4, in addition to including die 410, interconnect 420, package 430, interconnect 440, and PCB 450, the diagnostic cell circuitry-configured IC chip package 400 includes a reflection-type die level diagnostic cell circuitry stimulus driven diagnostic trace 490. In some embodiments, the reflection-type die level diagnostic cell circuitry stimulus driven diagnostic trace 490 is reflection circuitry (e.g., trace reflection circuitry) in diagnostic cell circuitry-configured IC chip package 400 that is utilized as a trace to reflect die level diagnostic cell circuitry-based stimulus 461 from various portions of the diagnostic cell circuitry-configured IC chip package 400.

In some embodiments, for the example diagnostic cell circuitry-configured IC chip package 400 in FIG. 4, a die level diagnostic cell circuitry-based stimulus generator in die level diagnostic cell circuitry 481 of die 410 generates die level diagnostic cell circuitry-based stimulus 461. The die level diagnostic cell circuitry-based stimulus 461 is transmitted to the reflection-type die level diagnostic cell circuitry stimulus driven diagnostic trace 490 and reflected signals (e.g., reflected die level diagnostic cell circuitry-based stimulus 462) that have been reflected from the various portions of the reflection-type die level diagnostic cell circuitry stimulus driven diagnostic trace 490 are received by the die level diagnostic cell circuitry 481.

In some embodiments, a die level diagnostic cell circuitry-based stimulus capturer in die level diagnostic cell circuitry 481 captures the reflected die level diagnostic cell circuitry-based stimulus 462 from the reflection-type die level diagnostic cell circuitry stimulus driven diagnostic trace 490. In some embodiments, the die level diagnostic cell circuitry-based stimulus capturer provides the reflected die level diagnostic cell circuitry-based stimulus 462 to a die level diagnostic assessment circuit in die level diagnostic cell circuitry 481.

In some embodiments, the die level diagnostic assessment circuit of die level diagnostic cell circuitry 481 assesses the reflected die level diagnostic cell circuitry-based stimulus 462 and generates the diagnostic parameters associated with the reflection-type die level diagnostic cell circuitry stimulus driven diagnostic trace 490. As illustrated in the diagnostic cell circuitry-configured IC chip package 400 of FIG. 4, the die level diagnostic cell circuitry 481 utilizes the reflection-type die level diagnostic cell circuitry stimulus driven diagnostic trace 490 to ascertain diagnostic parameters associated with diagnostic cell circuitry-configured IC chip package 400 without having to decapsulate diagnostic cell circuitry-configured IC chip package 400.

Figure 5:
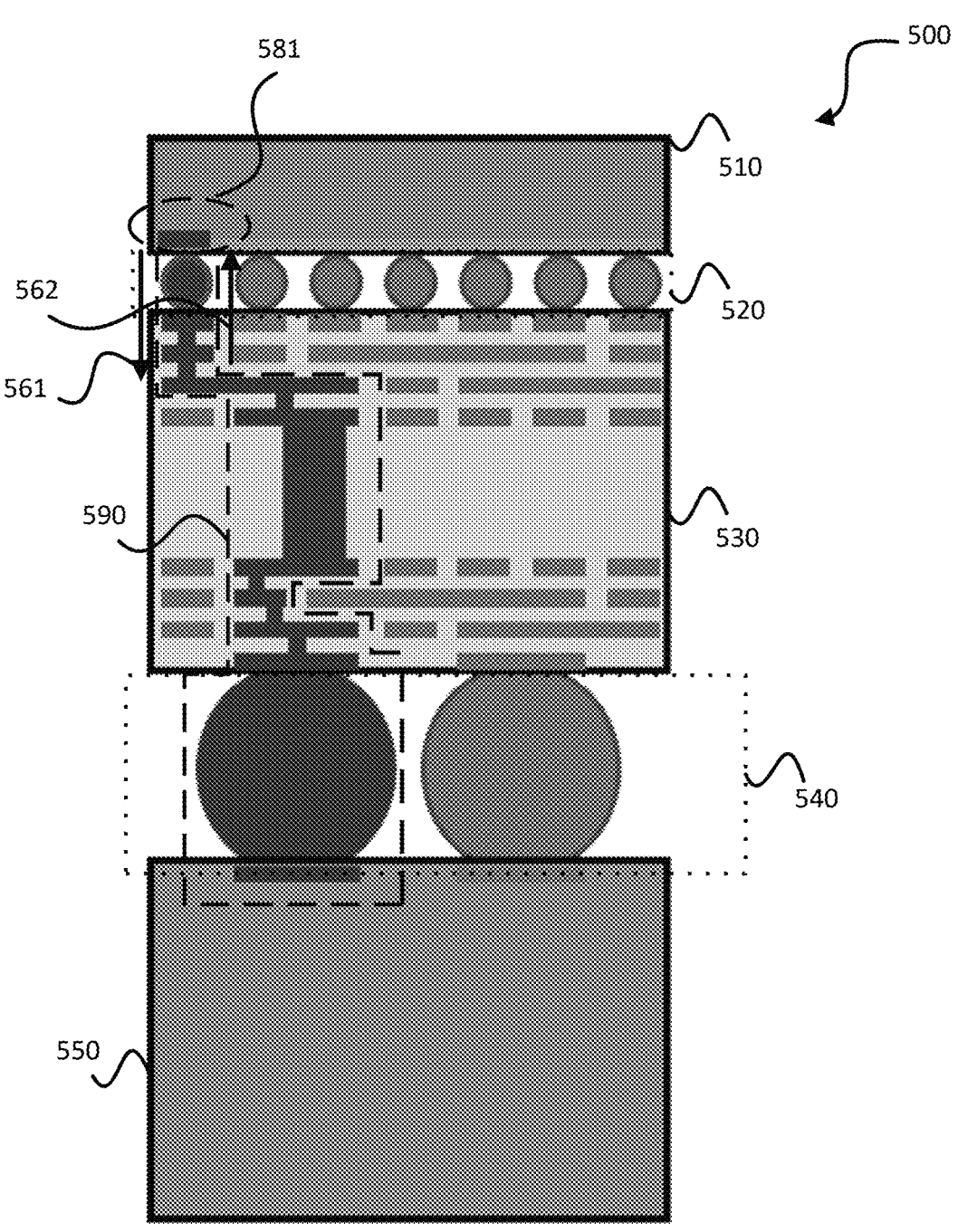
FIG. 5 illustrates an exemplary side view of an example diagnostic cell circuitry-configured IC chip package utilized to implement the die level diagnostic cell circuitry-based diagnostic testing method of FIG. 2 in accordance with some embodiments.

FIG. 5 illustrates a side view of an example diagnostic cell circuitry-configured IC chip package 500 in accordance with some embodiments. In some embodiments, the diagnostic cell circuitry-configured IC chip package 500 of FIG. 5 utilizes die level diagnostic cell circuitry-based diagnostic testing method 200 of FIG. 2 to perform decapsulation-free testing of the diagnostic cell circuitry-configured IC chip package 500. In the example illustrated in FIG. 5, in addition to including die 510, interconnect 520, package 530, interconnect 540, and PCB 550, the diagnostic cell circuitry-configured IC chip package 500 includes a reflection-type die level diagnostic cell circuitry stimulus driven diagnostic trace 590. In some embodiments, the reflection-type die level diagnostic cell circuitry stimulus driven diagnostic trace 590 is reflection circuitry in diagnostic cell circuitry-configured IC chip package 500 that is utilized as a trace to reflect die level diagnostic cell circuitry-based stimulus 561 from various portions of the diagnostic cell circuitry-configured IC chip package 500.

In some embodiments, for the example diagnostic cell circuitry-configured IC chip package 500 in FIG. 5, a die level diagnostic cell circuitry-based stimulus generator in die level diagnostic cell circuitry 581 of die 510 generates die level diagnostic cell circuitry-based stimulus 561. The die level diagnostic cell circuitry-based stimulus 561 is transmitted to the reflection-type die level diagnostic cell circuitry stimulus driven diagnostic trace 590 and reflected signals (e.g., reflected die level diagnostic cell circuitry-based stimulus 562) that have been reflected from the various portions of the reflection-type die level diagnostic cell circuitry stimulus driven diagnostic trace 590 are received by the die level diagnostic cell circuitry 581.

In some embodiments, a die level diagnostic cell circuitry-based stimulus capturer in die level diagnostic cell circuitry 581 captures the reflected die level diagnostic cell circuitry-based stimulus 562 from the reflection-type die level diagnostic cell circuitry stimulus driven diagnostic trace 590. The die level diagnostic cell circuitry-based stimulus capturer provides the reflected die level diagnostic cell circuitry-based stimulus 562 to a die level diagnostic assessment circuit in die level diagnostic cell circuitry 581.

In some embodiments, the die level diagnostic assessment circuit of die level diagnostic cell circuitry 581 assesses the reflected die level diagnostic cell circuitry-based stimulus 562 and generates the diagnostic parameters associated with the reflection-type die level diagnostic cell circuitry stimulus driven diagnostic trace 590. As illustrated in the diagnostic cell circuitry-configured IC chip package 500 of FIG. 5, the die level diagnostic cell circuitry 581 utilizes the reflection-type die level diagnostic cell circuitry stimulus driven diagnostic trace 590 to ascertain diagnostic parameters associated with diagnostic cell circuitry-configured IC chip package 500 without having to decapsulate diagnostic cell circuitry-configured IC chip package 500.

Figure 6:
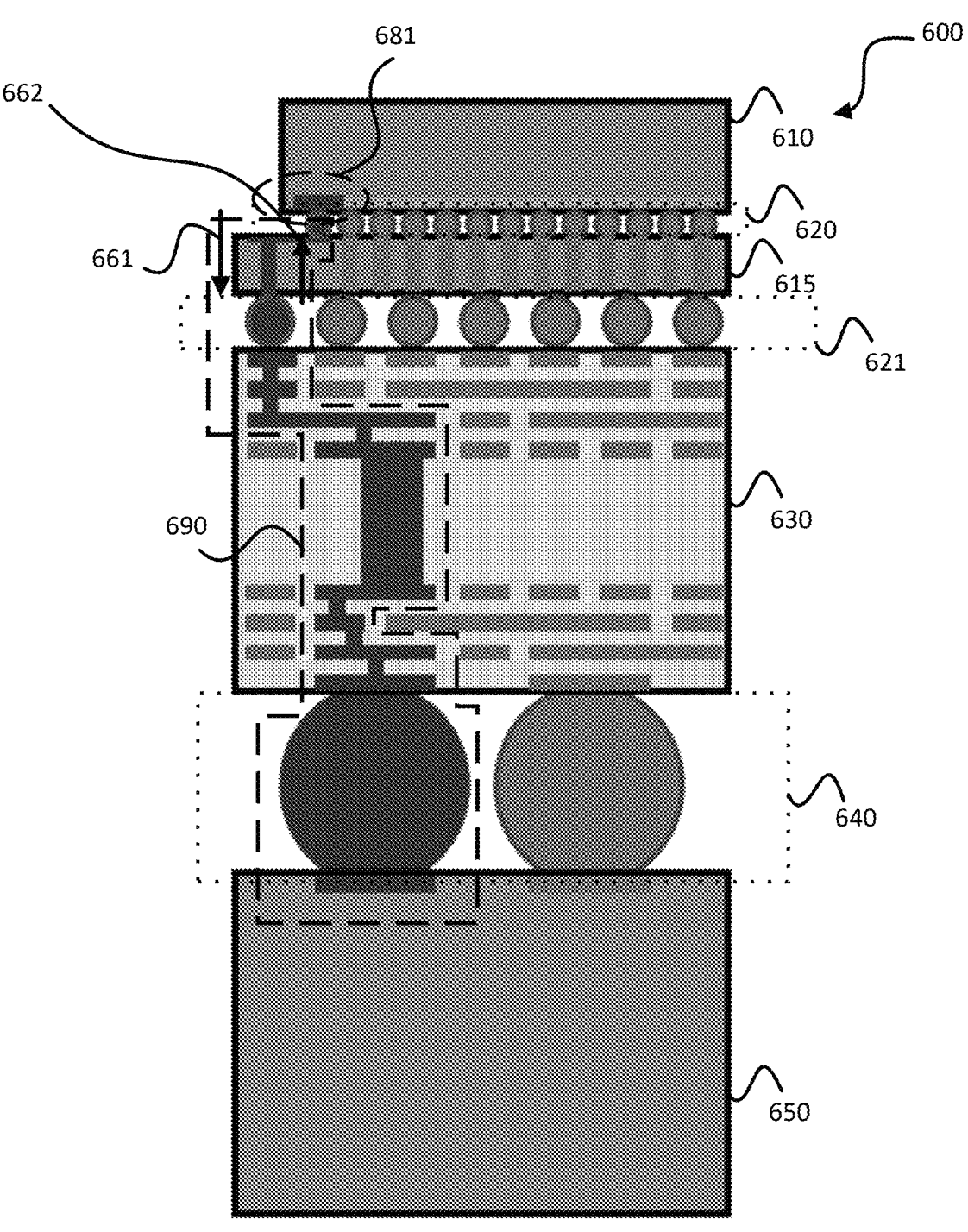
FIG. 6 illustrates an exemplary side view of an example diagnostic cell circuitry-configured IC chip package utilized to implement the die level diagnostic cell circuitry-based diagnostic testing method of FIG. 2 in accordance with some embodiments.

FIG. 6 illustrates a side view of an example diagnostic cell circuitry-configured IC chip package 600 in accordance with some embodiments. In some embodiments, the diagnostic cell circuitry-configured IC chip package 600 of FIG. 6 utilizes die level diagnostic cell circuitry-based diagnostic testing method 200 of FIG. 2 to perform decapsulation-free testing of the diagnostic cell circuitry-configured IC chip package 600. In the example illustrated in FIG. 6, in addition to including die 610, interconnect 620, die 615, interconnect 621, package 630, interconnect 640, and PCB 650, the diagnostic cell circuitry-configured IC chip package 600 includes a reflection-type die level diagnostic cell circuitry stimulus driven diagnostic trace 690. In some embodiments, the reflection-type die level diagnostic cell circuitry stimulus driven diagnostic trace 690 is reflection circuitry in diagnostic cell circuitry-configured IC chip package 600 that is utilized as a trace to reflect die level diagnostic cell circuitry-based stimulus 661 from various portions of the diagnostic cell circuitry-configured IC chip package 600.

In some embodiments, for the example diagnostic cell circuitry-configured IC chip package 600 in FIG. 6, a die level diagnostic cell circuitry-based stimulus generator in die level diagnostic cell circuitry 681 of die 610 generates die level diagnostic cell circuitry-based stimulus 661. The die level diagnostic cell circuitry-based stimulus 661 is transmitted to the reflection-type die level diagnostic cell circuitry stimulus driven diagnostic trace 690 and reflected signals (e.g., reflected die level diagnostic cell circuitry-based stimulus 662) that have been reflected from the various portions of the reflection-type die level diagnostic cell circuitry stimulus driven diagnostic trace 690 are received by the die level diagnostic cell circuitry 681.

In some embodiments, a die level diagnostic cell circuitry-based stimulus capturer in die level diagnostic cell circuitry 681 captures the reflected die level diagnostic cell circuitry-based stimulus 662 from the reflection-type die level diagnostic cell circuitry stimulus driven diagnostic trace 690. The die level diagnostic cell circuitry-based stimulus capturer provides the reflected die level diagnostic cell circuitry-based stimulus 662 to a die level diagnostic assessment circuit in die level diagnostic cell circuitry 681.

In some embodiments, the die level diagnostic assessment circuit of die level diagnostic cell circuitry 681 assesses the reflected die level diagnostic cell circuitry-based stimulus 662 and generates the diagnostic parameters associated with the reflection-type die level diagnostic cell circuitry stimulus driven diagnostic trace 690. As illustrated in the diagnostic cell circuitry-configured IC chip package 600 of FIG. 6, the die level diagnostic cell circuitry 681 utilizes the reflection-type die level diagnostic cell circuitry stimulus driven diagnostic trace 690 to ascertain diagnostic parameters associated with diagnostic cell circuitry-configured IC chip package 600 without having to decapsulate diagnostic cell circuitry-configured IC chip package 600.

Figure 7:
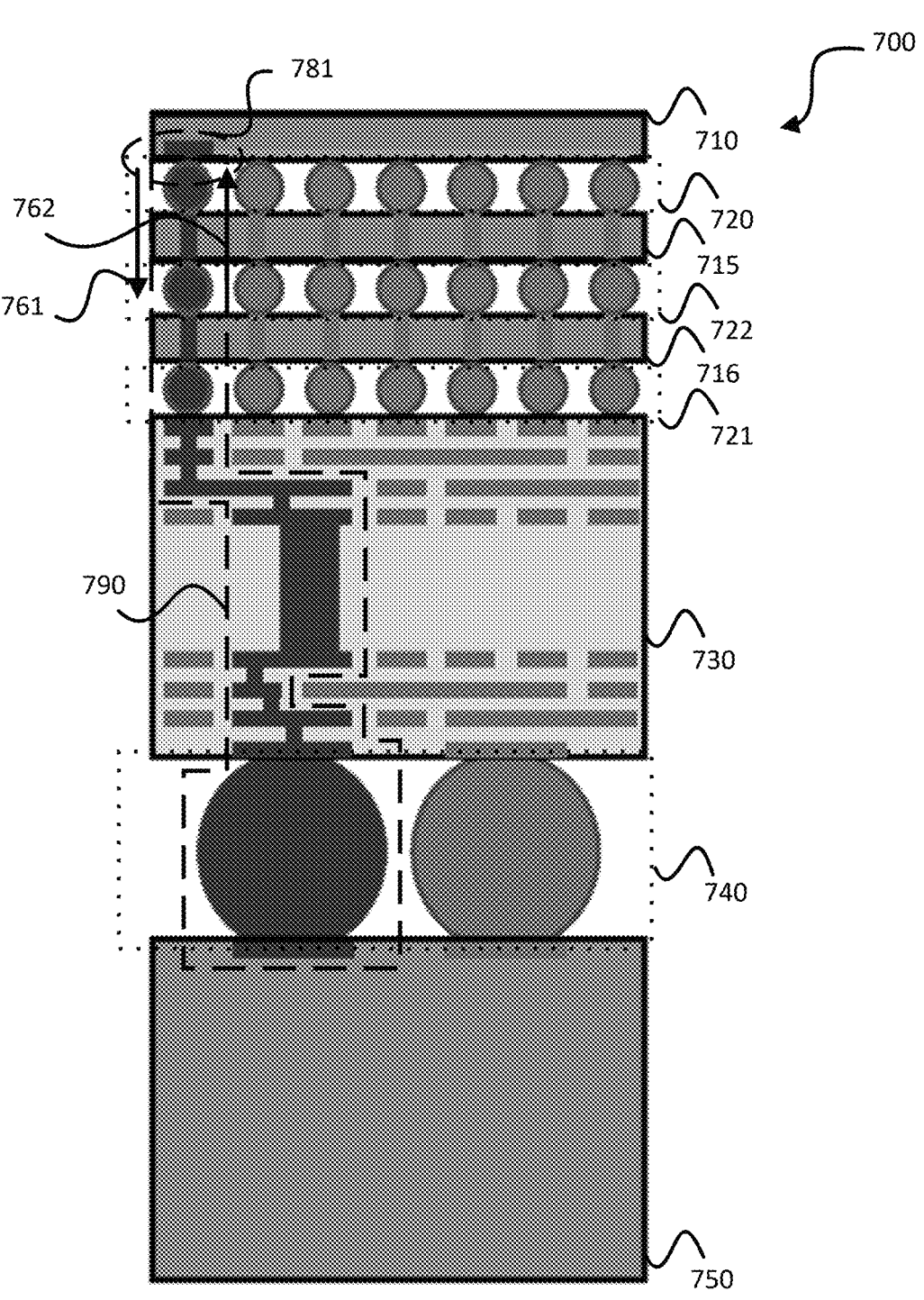
FIG. 7 illustrates an exemplary side view of an example diagnostic cell circuitry-configured IC chip package utilized to implement the die level-based diagnostic testing method of FIG. 2 in accordance with some embodiments.

FIG. 7 illustrates a side view of an example diagnostic cell circuitry-configured IC chip package 700 in accordance with some embodiments. In some embodiments, the diagnostic cell circuitry-configured IC chip package 700 of FIG. 7 utilizes die level diagnostic cell circuitry-based diagnostic testing method 200 of FIG. 2 to perform decapsulation-free testing of the diagnostic cell circuitry-configured IC chip package 700. In the example illustrated in FIG. 7, in addition to including die 710, interconnect 720, die 715, interconnect 722, die 716, interconnect 721, package 730, interconnect 740, and PCB 750, the diagnostic cell circuitry-configured IC chip package 700 includes a reflection-type die level diagnostic cell circuitry stimulus driven diagnostic trace 790. In some embodiments, the reflection-type die level diagnostic cell circuitry stimulus driven diagnostic trace 790 is reflection circuitry in diagnostic cell circuitry-configured IC chip package 700 that is utilized as a trace to reflect die level diagnostic cell circuitry-based stimulus 761 from various portions of the diagnostic cell circuitry-configured IC chip package 700.

In some embodiments, for the example diagnostic cell circuitry-configured IC chip package 700 in FIG. 7, a die level diagnostic cell circuitry-based stimulus generator in die level diagnostic cell circuitry 781 of die 710 generates die level diagnostic cell circuitry-based stimulus 761. The die level diagnostic cell circuitry-based stimulus 761 is transmitted to the reflection-type die level diagnostic cell circuitry stimulus driven diagnostic trace 790 and reflected signals (e.g., reflected die level diagnostic cell circuitry-based stimulus 762) that have been reflected from the various portions of the reflection-type die level diagnostic cell circuitry stimulus driven diagnostic trace 790 are received by the die level diagnostic cell circuitry 781.

In some embodiments, a die level diagnostic cell circuitry-based stimulus capturer in die level diagnostic cell circuitry 781 captures the reflected die level diagnostic cell circuitry-based stimulus 762 from the reflection-type die level diagnostic cell circuitry stimulus driven diagnostic trace 790. The die level diagnostic cell circuitry-based stimulus capturer provides the reflected die level diagnostic cell circuitry-based stimulus 762 to a die level diagnostic assessment circuit in die level diagnostic cell circuitry 781.

In some embodiments, the die level diagnostic assessment circuit of die level diagnostic cell circuitry 781 assesses the reflected die level diagnostic cell circuitry-based stimulus 762 and generates the diagnostic parameters associated with the reflection-type die level diagnostic cell circuitry stimulus driven diagnostic trace 790. As illustrated in the diagnostic cell circuitry-configured IC chip package 700 of FIG. 7, the die level diagnostic cell circuitry 781 utilizes the reflection-type die level diagnostic cell circuitry stimulus driven diagnostic trace 790 to ascertain diagnostic parameters associated with diagnostic cell circuitry-configured IC chip package 700 without having to decapsulate diagnostic cell circuitry-configured IC chip package 700.

Figure 8:
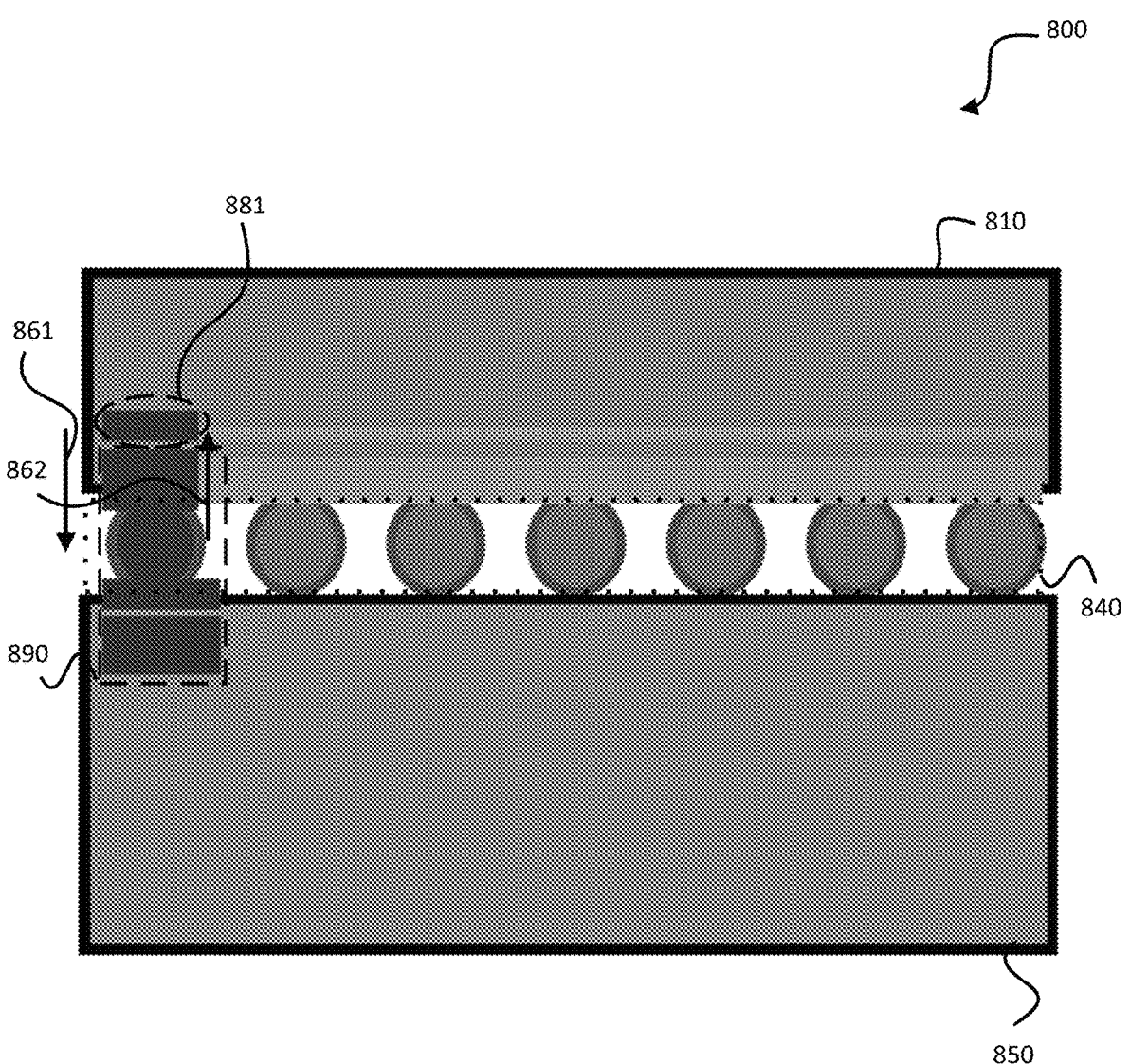
FIG. 8 illustrates an exemplary side view of an example diagnostic cell circuitry-configured IC chip package utilized to implement the die level diagnostic cell circuitry-based diagnostic testing method of FIG. 2 in accordance with some embodiments.

FIG. 8 illustrates a side view of an example diagnostic cell circuitry-configured IC chip package 800 in accordance with some embodiments. In some embodiments, the diagnostic cell circuitry-configured IC chip package 800 of FIG. 8 utilizes die level diagnostic cell circuitry-based diagnostic testing method 200 of FIG. 2 to perform decapsulation-free testing of the diagnostic cell circuitry-configured IC chip package 800. In the example illustrated in FIG. 8, in addition to including die 810, interconnect 840, and PCB 850, the diagnostic cell circuitry-configured IC chip package 800 includes a reflection-type die level diagnostic cell circuitry stimulus driven diagnostic trace 890. In some embodiments, the reflection-type die level diagnostic cell circuitry stimulus driven diagnostic trace 890 is reflection circuitry in diagnostic cell circuitry-configured IC chip package 800 that is utilized as a trace to reflect die level diagnostic cell circuitry-based stimulus 861 from various portions of the diagnostic cell circuitry-configured IC chip package 800.

In some embodiments, for the example diagnostic cell circuitry-configured IC chip package 800 in FIG. 8, a die level diagnostic cell circuitry-based stimulus generator in die level diagnostic cell circuitry 881 of die 810 generates die level diagnostic cell circuitry-based stimulus 861. The die level diagnostic cell circuitry-based stimulus 861 is transmitted to the reflection-type die level diagnostic cell circuitry stimulus driven diagnostic trace 890 and reflected signals (e.g., reflected die level diagnostic cell circuitry-based stimulus 862) that have been reflected from the various portions of the reflection-type die level diagnostic cell circuitry stimulus driven diagnostic trace 890 are received by the die level diagnostic cell circuitry 881.

In some embodiments, a die level diagnostic cell circuitry-based stimulus capturer in die level diagnostic cell circuitry 881 captures the reflected die level diagnostic cell circuitry-based stimulus 862 from the reflection-type die level diagnostic cell circuitry stimulus driven diagnostic trace 890. The die level diagnostic cell circuitry-based stimulus capturer provides the reflected die level diagnostic cell circuitry-based stimulus 862 to a die level diagnostic assessment circuit in die level diagnostic cell circuitry 881.

In some embodiments, the die level diagnostic assessment circuit of die level diagnostic cell circuitry 881 assesses the reflected die level diagnostic cell circuitry-based stimulus 862 and generates the diagnostic parameters associated with the reflection-type die level diagnostic cell circuitry stimulus driven diagnostic trace 890. As illustrated in the diagnostic cell circuitry-configured IC chip package 800 of FIG. 8, the die level diagnostic cell circuitry 881 utilizes the reflection-type die level diagnostic cell circuitry stimulus driven diagnostic trace 890 to ascertain diagnostic parameters associated with diagnostic cell circuitry-configured IC chip package 800 without having to decapsulate diagnostic cell circuitry-configured IC chip package 800.

Figure 9:
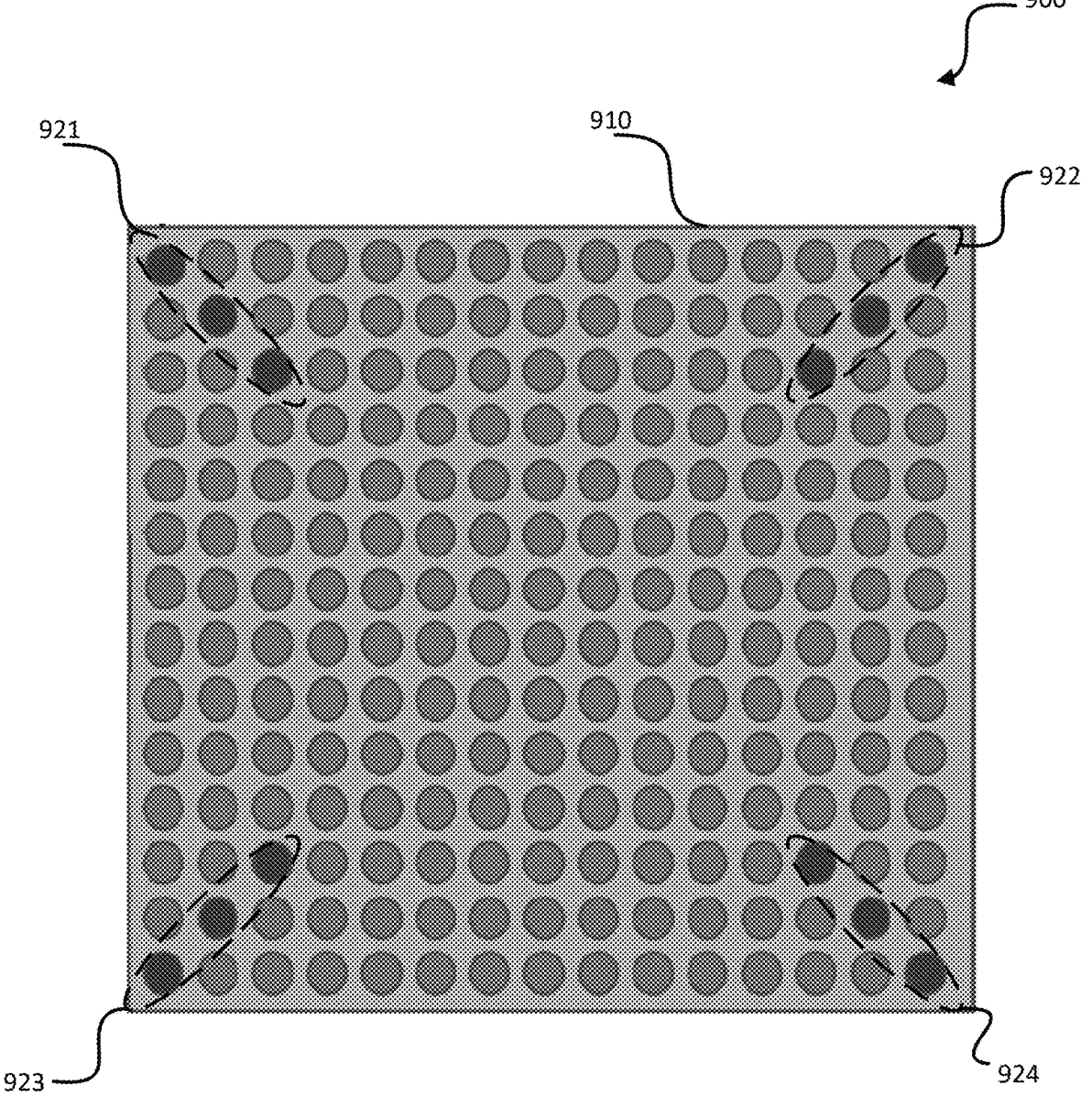
FIG. 9 illustrates an exemplary bottom-up view of an example die of a diagnostic cell circuitry-configured IC chip package in accordance with some embodiments.

FIG. 9 illustrates an exemplary bottom-up view of a die 910 of a diagnostic cell circuitry-configured IC chip package. In some embodiments, the die 910 of FIG. 9 illustrates solder bump connections (e.g., solder bump connection 921, solder bump connection 922, solder bump connection 923, solder bump connection 924) utilized to connect the die 910 to a package or PCB of the diagnostic cell circuitry-configured IC chip package. As illustrated in FIG. 9, the solder bump connections are positioned at the corners of the die 910, which are locations on die 910 of the die level diagnostic cell circuitry utilized to ascertain the aforementioned diagnostic parameters of the diagnostic cell circuitry-configured IC chip package described herein.

In some embodiments, an integrated circuit chip package, includes a die; and die level diagnostic cell circuitry embedded in the die at a die level diagnostic testing location, wherein the die level diagnostic cell circuitry located at the die level diagnostic testing location incorporates a use of a die level diagnostic cell circuitry-based stimulus to test a die level diagnostic cell circuitry stimulus driven diagnostic trace of the integrated circuit chip package without requiring a decapsulation of the integrated circuit chip package.

In some embodiments of the integrated circuit chip package, in order to test the die level diagnostic cell circuitry stimulus driven diagnostic trace of the integrated circuit chip package, the die level diagnostic cell circuitry-based stimulus is driven through the die level diagnostic cell circuitry stimulus driven diagnostic trace.

In some embodiments of the integrated circuit chip package, the die level diagnostic cell circuitry-based stimulus is at least one of a time domain diagnostic stimulus or a frequency domain diagnostic stimulus.

In some embodiments of the integrated circuit chip package, the die level diagnostic cell circuitry stimulus driven diagnostic trace includes at least one of transmission circuitry or reflection circuitry.

In some embodiments of the integrated circuit chip package, the die level diagnostic testing location includes a corner location of the die.

In some embodiments of the integrated circuit chip package, the die level diagnostic cell circuitry-based stimulus is driven through the die level diagnostic cell circuitry stimulus driven diagnostic trace to determine a failure onset.

In some embodiments of the integrated circuit chip package, the die level diagnostic cell circuitry allows for a built-in approach to determine diagnostic characteristics associated with the die level diagnostic cell circuitry stimulus driven diagnostic trace of the integrated circuit chip package.

In some embodiments of the integrated circuit chip package, the die level diagnostic cell circuitry is utilized to ascertain at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

In some embodiments, a die includes die level diagnostic cell circuitry embedded in the die at a die level diagnostic testing location, wherein the die level diagnostic cell circuitry located at the die level diagnostic testing location utilizes a die level diagnostic cell circuitry-based stimulus to test a die level diagnostic cell circuitry stimulus driven diagnostic trace coupled to the die.

In some embodiments of the die, in order to test the die level diagnostic cell circuitry stimulus driven diagnostic trace, the die level diagnostic cell circuitry-based stimulus is driven through the die level diagnostic cell circuitry stimulus driven diagnostic trace.

In some embodiments of the die, the die level diagnostic cell circuitry-based stimulus is at least one of a time domain diagnostic stimulus or a frequency domain diagnostic stimulus.

In some embodiments of the die, the die level diagnostic cell circuitry stimulus driven diagnostic trace includes at least one of transmission circuitry or reflection circuitry.

In some embodiments of the die, the die level diagnostic testing location includes a corner location of the die.

In some embodiments of the die, the die level diagnostic cell circuitry-based stimulus is driven through the die level diagnostic cell circuitry stimulus driven diagnostic trace coupled to the die to determine a failure onset.

In some embodiments of the die, the die level diagnostic cell circuitry allows for a built-in approach to determine diagnostic characteristics associated with the die level diagnostic cell circuitry stimulus driven diagnostic trace coupled to the die.

In some embodiments of the die, an impedance mismatch associated with the die level diagnostic cell circuitry stimulus driven diagnostic trace is measured utilizing the die level diagnostic cell circuitry.

In some embodiments of the die, the die level diagnostic cell circuitry is utilized to ascertain at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

In some embodiments of the die, the die level diagnostic cell circuitry is utilized to capture a slew rate associated with the die level diagnostic cell circuitry stimulus driven diagnostic trace.

In some embodiments, an integrated circuit chip testing method includes allocating an embedded portion of die circuitry of a die located in an integrated circuit chip package as die level diagnostic cell circuitry; generating a die level diagnostic cell circuitry-based stimulus at the die level diagnostic cell circuitry; and utilizing the die level diagnostic cell circuitry-based stimulus and the die level diagnostic cell circuitry to test a die level diagnostic cell circuitry stimulus driven diagnostic trace of the integrated circuit chip package without requiring a decapsulation of the integrated circuit chip package.

In some embodiments, the method further includes utilizing the die level diagnostic cell circuitry to capture at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

What is claimed is:

1. An integrated circuit chip package, comprising:
a die;
a printed circuit board (PCB); and
die level diagnostic cell circuitry embedded in the die, wherein the die level diagnostic cell circuitry is configured to receive a die level diagnostic cell circuitry-based stimulus thorough a die level diagnostic cell circuitry stimulus driven diagnostic trace that extends through the die and into the PCB to test the die level diagnostic cell circuitry stimulus driven diagnostic trace without requiring a decapsulation of the integrated circuit chip package;
wherein the die level diagnostic cell circuitry is utilized to capture a slew rate associated with the die level diagnostic cell circuitry stimulus driven diagnostic trace.

2. The integrated circuit chip package of claim 1, wherein:
in order to test the die level diagnostic cell circuitry stimulus driven diagnostic trace of the integrated circuit chip package, the die level diagnostic cell circuitry-based stimulus is driven through the die level diagnostic cell circuitry stimulus driven diagnostic trace.

3. The integrated circuit chip package of claim 2, wherein:
the die level diagnostic cell circuitry-based stimulus is at least one of a time domain diagnostic stimulus or a frequency domain diagnostic stimulus.

4. The integrated circuit chip package of claim 3, wherein:
the die level diagnostic cell circuitry stimulus driven diagnostic trace includes at least one of transmission circuitry or reflection circuitry.

5. The integrated circuit chip package of claim 4, wherein:
die level diagnostic cell circuitry is embedded in the die at a corner location of the die.

6. The integrated circuit chip package of claim 5, wherein:
the die level diagnostic cell circuitry-based stimulus is driven through the die level diagnostic cell circuitry stimulus driven diagnostic trace to determine a failure onset.

7. The integrated circuit chip package of claim 6, wherein:
the die level diagnostic cell circuitry allows for a built-in approach to determine diagnostic characteristics associated with the die level diagnostic cell circuitry stimulus driven diagnostic trace of the integrated circuit chip package.

8. The integrated circuit chip package of claim 7, wherein:
the die level diagnostic cell circuitry is utilized to ascertain at least one of an inductance associated with the die level diagnostic cell circuitry stimulus driven diagnostic trace, capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

9. A die, comprising:
die level diagnostic cell circuitry embedded in the die, wherein the die level diagnostic cell circuitry is configured to receive a die level diagnostic cell circuitry-based stimulus thorough a die level diagnostic cell circuitry stimulus driven diagnostic trace that extends through the die and into a printed circuit board (PCB) coupled to the die to test the die level diagnostic cell circuitry stimulus driven diagnostic trace without requiring a decapsulation of an integrated circuit chip package including the die and the PCB; and
wherein the die level diagnostic cell circuitry is utilized to capture a slew rate associated with the die level diagnostic cell circuitry stimulus driven diagnostic trace.

10. The die of claim 9, wherein:
in order to test the die level diagnostic cell circuitry stimulus driven diagnostic trace, the die level diagnostic cell circuitry-based stimulus is driven through the die level diagnostic cell circuitry stimulus driven diagnostic trace.

11. The die of claim 10, wherein:
the die level diagnostic cell circuitry-based stimulus is at least one of a time domain diagnostic stimulus or a frequency domain diagnostic stimulus.

12. The die of claim 11, wherein:
the die level diagnostic cell circuitry stimulus driven diagnostic trace includes at least one of transmission circuitry or reflection circuitry.

13. The die of claim 12, wherein:
die level diagnostic cell circuitry is embedded in the die at a corner location of the die.

14. The die of claim 13, wherein:
the die level diagnostic cell circuitry-based stimulus is driven through the die level diagnostic cell circuitry stimulus driven diagnostic trace coupled to the die to determine a failure onset.

15. The die of claim 14, wherein:
the die level diagnostic cell circuitry allows for a built-in approach to determine diagnostic characteristics associated with the die level diagnostic cell circuitry stimulus driven diagnostic trace coupled to the die.

16. The die of claim 15, wherein:
an impedance mismatch associated with the die level diagnostic cell circuitry stimulus driven diagnostic trace is measured utilizing the die level diagnostic cell circuitry.

17. The die of claim 16, wherein:
the die level diagnostic cell circuitry is utilized to ascertain at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

18. An integrated circuit chip testing method, comprising:
allocating an embedded portion of die circuitry of a die located in an integrated circuit chip package as die level diagnostic cell circuitry;
generating a die level diagnostic cell circuitry-based stimulus at the die level diagnostic cell circuitry that is transmitted through a die level diagnostic cell circuitry stimulus driven diagnostic trace that extends through the die and into printed circuit board (PCB) of the integrated circuit chip package;
utilizing the die level diagnostic cell circuitry-based stimulus and the die level diagnostic cell circuitry to test the die level diagnostic cell circuitry stimulus driven diagnostic trace without requiring a decapsulation of the integrated circuit chip package; and utilizing the die level diagnostic cell circuitry is utilized to capture a slew rate associated with the die level diagnostic cell circuitry stimulus driven diagnostic trace.

19. The method of claim 18, further comprising:

utilizing the die level diagnostic cell circuitry to capture at least one of an inductance associated with the die level diagnostic cell circuitry stimulus driven diagnostic trace, a capacitance associated with the die level diagnostic cell circuitry stimulus driven diagnostic trace, an impedance associated with the die level diagnostic cell circuitry stimulus driven diagnostic trace, and a resistance associated with the die level diagnostic cell circuitry stimulus driven diagnostic trace.

\* \* \* \* \*